(12) United States Patent
Walsh et al.

(10) Patent No.: US 6,791,317 B1
(45) Date of Patent: Sep. 14, 2004

(54) LOAD BOARD FOR TESTING OF RF CHIPS

(75) Inventors: Stephen Walsh, Croydon (AU); Henry Liu, Connells Point (AU)

(73) Assignee: Cisco Technology, Inc., San Jose, CA (US)

(*) Notice: Subject to any disclaimer, the term of this patent is extended or adjusted under 35 U.S.C. 154(b) by 21 days.

(21) Appl. No.: 10/307,738

(22) Filed: Dec. 2, 2002

(51) Int. Cl.$^7$ .............................................. G01R 31/02

(52) U.S. Cl. ..................................... 324/158.1; 439/63

(58) Field of Search ................... 324/73.1, 754–755, 324/158.1; 439/63, 65, 74–75, 581; 333/260

(56) References Cited

U.S. PATENT DOCUMENTS

| | | | |
|---|---|---|---|
| 3,201,722 A | * 8/1965 | May et al. ...................... 333/33 |
| 3,689,865 A | * 9/1972 | Pierini et al. .................. 439/60 |
| 4,337,989 A | * 7/1982 | Asick et al. .................. 439/609 |
| 5,059,892 A | 10/1991 | Stoft .......................... 324/73.1 |
| 5,477,159 A | * 12/1995 | Hamling ...................... 324/754 |
| 5,558,541 A | 9/1996 | Botka et al. ................. 439/675 |
| 5,594,355 A | 1/1997 | Ludwig ....................... 324/755 |
| 5,668,408 A | 9/1997 | Nicholson .................... 257/699 |
| 5,944,548 A | 8/1999 | Saito ........................... 439/248 |
| 5,967,848 A | 10/1999 | Johnson et al. ............. 439/620 |
| 5,969,535 A | 10/1999 | Saito ........................... 324/758 |
| 6,037,788 A | 3/2000 | Krajec et al. ................ 324/755 |
| 6,049,219 A | 4/2000 | Hwang et al. ............... 324/765 |
| 6,061,251 A | 5/2000 | Hutchison et al. .......... 361/820 |
| 6,070,478 A | 6/2000 | Krajec et al. ............. 73/865.89 |
| 6,158,899 A | 12/2000 | Arp et al. ...................... 385/53 |
| 6,188,968 B1 | 2/2001 | Blackham ..................... 702/85 |
| 6,236,223 B1 | 5/2001 | Brady et al. ................. 324/765 |
| 6,249,621 B1 | 6/2001 | Sargent, IV et al. .......... 385/24 |
| 6,262,571 B1 | 7/2001 | Krajec ....................... 324/158.1 |
| 6,271,673 B1 | 8/2001 | Furuta et al. ................ 324/754 |
| 6,298,738 B1 | 10/2001 | Krajec et al. .............. 73/865.9 |
| 6,384,617 B1 | 5/2002 | Krajec et al. ............... 324/755 |
| 6,407,652 B1 | * 6/2002 | Kan ............................. 333/260 |
| 6,452,379 B1 | 9/2002 | Cartier ..................... 324/158.1 |
| 6,469,495 B1 | 10/2002 | Boswell et al. .......... 124/158.1 |

OTHER PUBLICATIONS

"Agilent SOC (Systems–on–a–chip) Test: RF Measurement Suite for the 93000 SOC Series Platform", Agilent Technologies, Palo Alto, CA, 2002, no month.

"Agilent 93000 SOC Series RF Measurement Suite: Product Note", Agilent Technologies, Palo Alto, CA, Jan. 10, 2002.

"Agilent 84000 RFIC System Test Fixtures and Accessories: Configuration Guide", Agilent Technologies, Palo Alto, CA, 1999, 2000, no month.

"IC Test Boards", ELES Semiconductor, Equipment SpA, available on http://www.eles.com as "IC Test Boards.pdf", no month, year.

(List continued on next page.)

*Primary Examiner*—Minh N. Tang
(74) *Attorney, Agent, or Firm*—Dov Rosenfeld; Inventek (57) ABSTRACT

A load board for connecting an RF integrated circuit device ("DUT") to a tester for testing. The load board includes a PCB having a DUT side and a non-DUT side. The DUT is insertable to a socket on the DUT side. The non-DUT side is accessible to one or more RF connectors to which an RF cable is connectable. Each RF connector provides an RF connection to a tester. The PCB includes at least one aperture through which a coaxial connection may be made to a cable connected to one of the RF connectors. Each coaxial connection through each aperture is electrically coupled on the DUT side to the DUT socket and matched for a range of frequencies up to at least approximately 5 GHz, including the frequencies used in the IEEE 802.11a standard.

22 Claims, 6 Drawing Sheets

OTHER PUBLICATIONS

W. Y. Lau, "Measurement Challenges for On–Wafer RF–SOC Test", Agilent Technologies, *SEMI Technology Symposium: International Electronics Manufacturing Technology (IEMT) Symposium*, SEMICON West 2002, no month.

D. Whitefield, "Design Features: Perform Production Testing on Millimeter–Wave MMICS", MWRF Aug. 1999, pp. 1–4, available on http://www.planetee.com/planetee/servlet/DisplayDocument?ArticleID=8994.

"SMA—50 Ohm Connectors, End Launch Connectors", Johnson Components, pp. 1–7, Waseca, MN, available on www.johnsoncomp.com, no month, year.

D. Gahagan, "RF (Gigahertz) ATE Production Testing On–Wafer: Options and Tradeoffs", reprinted from an article presented by D. Gahagan of Cascade Microtech at the International Test Conference, 1999, no month.

\* cited by examiner

LOAD BOARD FOR TESTING OF RF CHIPS

BACKGROUND

This invention is related to the testing of radio frequency chips and in particular to a method and apparatus for testing integrated circuits ("chips") that overcomes many of the disadvantages of the prior art.

Many companies are now producing radio frequency (RF) chips for use in wireless local area networks (WLANs) and other wireless applications. For these chips to be economically mass-produced, a testing apparatus and method are desired that do not require a high level of expertise to operate.

A typical test system tests a device, called that the "device under test" (DUT), e.g., an RF chip that has been mounted on a "load board." A typical load board is a printed circuit board (PCB) that may be about 30 cm by 30 cm, and about 5 mm thick. The load board sits on top of a tester and includes a set of probes. The probes are connected to a set of instruments, including RF signal sources and measuring devices.

Figure 1:
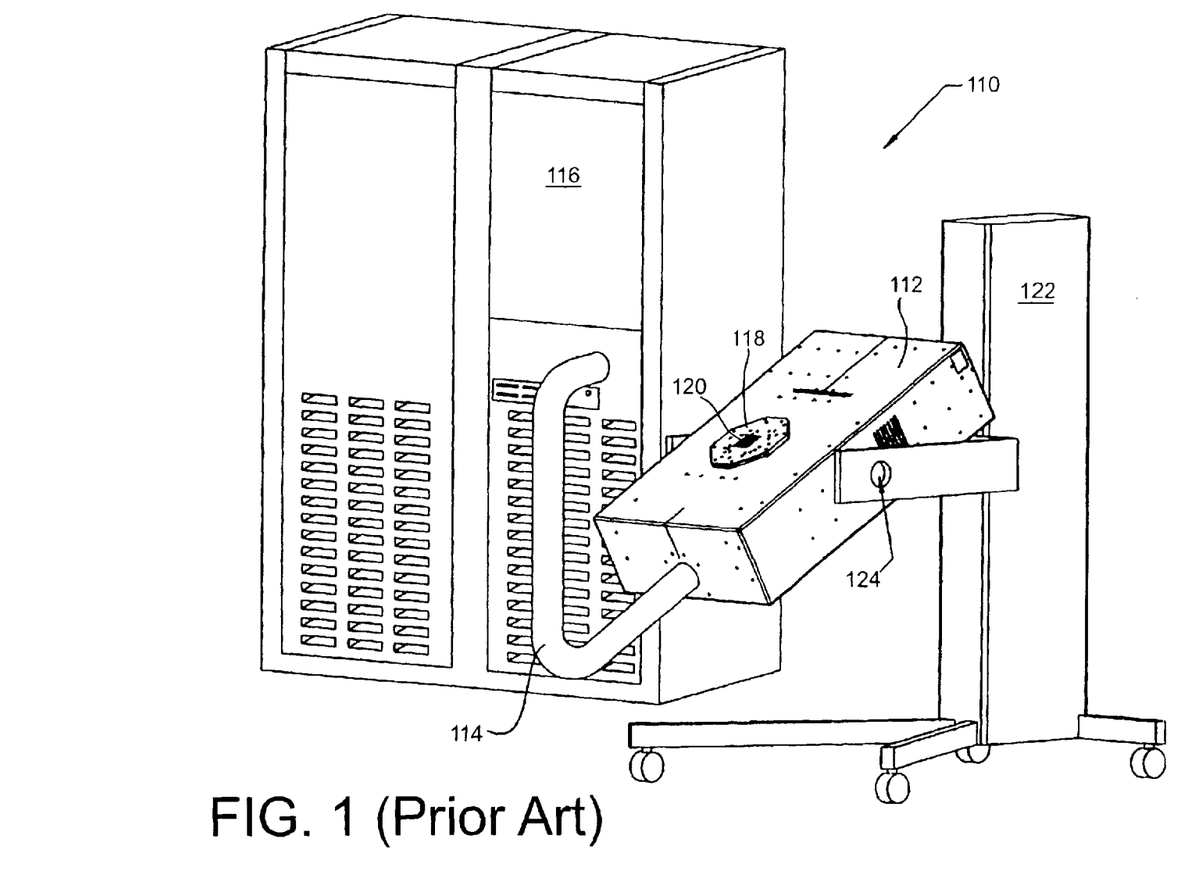
FIG. 1 shows a conventional programmable electronic circuit test system with which a load board embodiment of the invention may be used.

A conventional programmable electronic circuit test system, generally indicated by the numeral 110, is shown in FIG. 1. The electronic circuit tester 110 comprises a test head 112 electrically connected by cables routed through a conduit 114 to one or more rack(s) 116 of electronic test and measurement instruments, such as ac and dc electrical signal generators for applying electrical signals to a device or integrated circuit interfaced to the test head, and signal analyzers, for example, an oscilloscope and a network analyzer, for measuring the response(s) to those applied electrical signals. As shown in FIG. 1, the test head 112 interfaces to the DUT 120 via a load board 118 connected to the cables in the conduit 114. The DUT 120 is connected to the load board via a socket. The configuration of the load board 118 depends on the type of DUT.

As shown in FIG. 1, the test head 112 is mounted on a dolly 122. Since the electronic circuit tester 10 can be employed to test both packaged devices and integrated circuits, as well as device or integrated circuit chips on wafer, the test head 112 is preferably mounted by pivotable connections 124 to the dolly 122. The pivotable connections 124 enable the test head 112 to be positioned in an approximately upward facing horizontal position so that the appropriate load board 118 can be mounted on the test head of the electronic circuit tester 110 by an operator.

For testing in a production environment, the instruments are programmed to carry out a set of tests automatically. Once the load board 118 is mounted, one DUT 120 after another is loaded into a matching socket on the load board 118, then unloaded, then a new DUT is loaded. The loading and unloading is carried out automatically by an automatic chip-handling machine ("handler"), not shown in FIG. 1.

Figure 2:
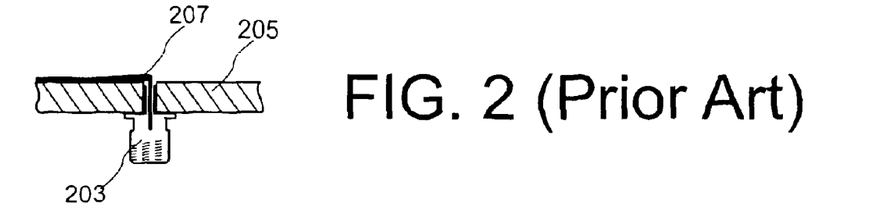
FIG. 2 shows a prior art connector passing through a section of a prior art load board.

Because of the need to automatically load and unload the DUTs, in one embodiment, the DUT faces upwards where it is reachable by an automatic loader, while the RF connection to and from the tester, e.g., to provide RF signal to the load board or to accepting RF signals from the load board, are on the opposite side of the load board than is the DUT. The load board therefore has to carry RF signals to and from one side of the board from and to the other. In the prior art, for frequencies up to about a GHz or two, connectors are used that pass through the load board. FIG. 2 shows one such prior art connector 203 passing through a section 205 of a load board.

For applications such as WLANs, the range of frequencies of interest may be in the multi-GHz range. The IEEE 802.11a standard, for example, uses several frequencies between 5.0 and 5.8 GHz. Accurately coupling the DUT 120 and load board 118 to the tester normally requires matching to the particular frequency of a test. Such matching might require additional circuitry, e.g., such microwave passive components as microwave capacitors, and so forth.

The prior art method of passing RF signals from one side of the board to the other side is not suitable for frequencies in the range of 5 GHz or higher. When connector 203 passes through the load board section 205, there is a 90-degree connection 207 at the top (IC) side of the load board. Such a bend causes mismatch problems at frequencies in the range of 5 GHz or higher. Boards that are 5 mm thick as load boards can be may start having problems at frequencies as low as 1 GHz.

Furthermore, the tuning for one frequency, e.g., one frequency channel of a WLAN, may not be applicable to any other frequency. A skilled engineer therefore typically carries out tuning. Such is clearly not amenable to a mass production environment.

There thus is a need for an apparatus and test method that avoids re-tuning, can test multiple frequencies in the multi-GHz range without requiring re-calibration, is easily reproduced in the field, and is operable by a low-skilled operator.

SUMMARY

Disclosed herein is load board for connecting an RF integrated circuit device (the DUT) to a tester for testing. The load board includes a PCB having a DUT side and a non-DUT side. The DUT is insertable to a socket on the DUT side. The non-DUT side is accessible to one or more RF connectors to which an RF cable is connectable. Each RF connector provides an RF connection to a tester. The PCB includes at least one aperture through which a coaxial connection may be made to a cable connected to one of the RF connectors. Each coaxial connection through each aperture is electrically coupled on the DUT side to the DUT socket and matched for a range of frequencies up to at least approximately 5 GHz, including the frequencies used in the IEEE 802.11a standard.

One embodiment of the load board has an end launch connector on one edge of each aperture that has a coaxial connection. Each end launch connector is electrically connected to the socket and matched for the range of frequencies up to at least 5.8 GHz, such that the coaxial connection through each aperture is via the end launch connector at the edge of the aperture.

Also disclosed is a method for connecting radio frequency signals from the DUT side to the non-DUT side of a load board. The board including a socket on the DUT side into which the DUT is insertable. The method includes providing at least one aperture on the board, making a coaxial connection from the DUT side to the non-DUT side of the board though the aperture, electrically coupling the DUT side of the coaxial connection with the socket, and matching the coaxial connection for a range of frequencies up to at least approximately 5 GHz, including the frequencies of the IEEE 802.11a standard. The non-DUT side of the coaxial connection is accessible to one of a set of one or more RF connectors onto which an RF cable is connectable. Each such RF connector providing an RF connection to the tester such that RF signals in the range of frequencies can be input to or output from the tester from or to a DUT inserted in the socket.

One embodiment of the method includes mounting an end launch connector on an edge of each aperture through which there is a coaxial connection. Each end launch connector is electrically coupled to the socket and matched for the range of frequencies up to at least 5.8 GHz, so that the electrical coupling on the DUT side of the coaxial connection with the socket is via the end launch connector at the edge of the aperture.

BRIEF DESCRIPTION OF THE DRAWINGS

FIGS. 5C and 5D show two embodiments of connecting a cable to the end launch connector.

DETAILED DESCRIPTION

Described herein is a load board that can be used for testing RF devices in the multi-GHz frequency range. In particular, described herein is a load board suitable for testing chips for wireless local area networks in the 5 GHz range.

Figure 3A:
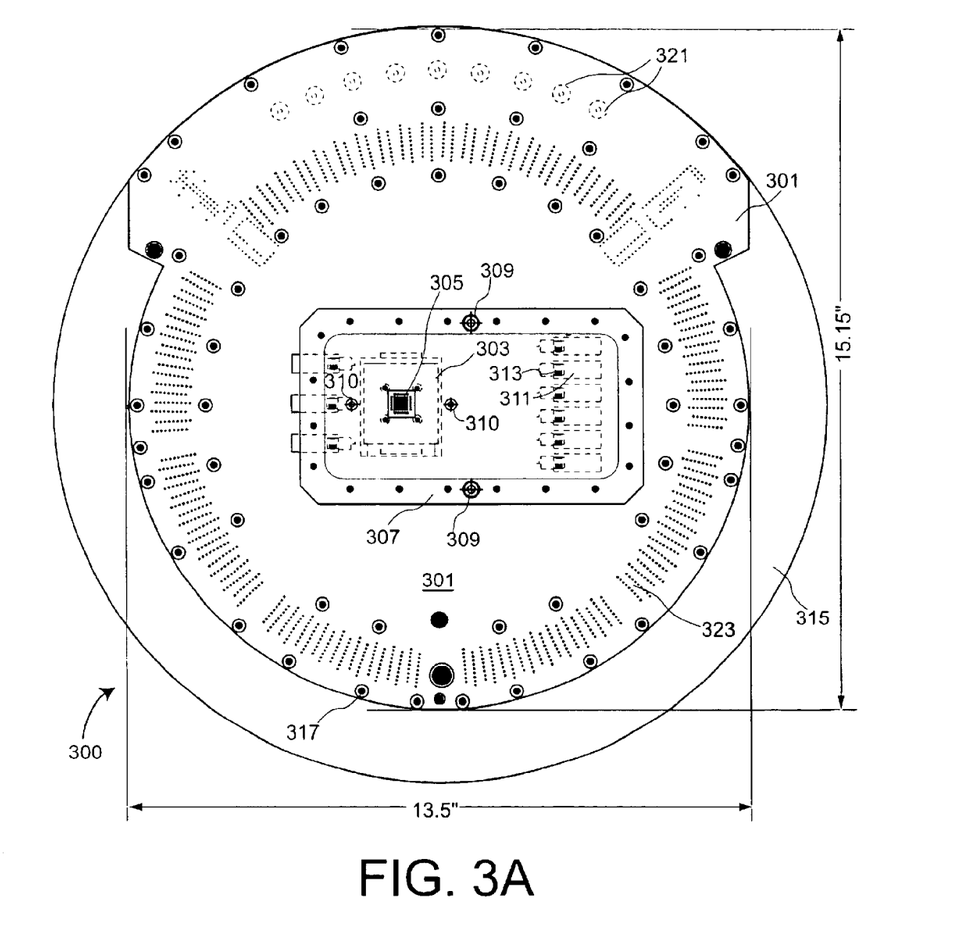
FIG. 3A shows the DUT side of one embodiment of a load board.

FIG. 3A shows a plan view of the DUT side of a load board 300 for mounting on a tester such as that shown in FIG. 1. The load board includes a multi-layer PCB 301 constructed from printed circuit material suitable to operate in the frequency range of interest. The load board 300 includes a socket 303 into which an RF chip 305—the DUT—is inserted by a handler (not shown).

Because the load board is relatively large, a frame 315 is screwed onto the PCB. The frame includes RF connectors that plug into the test head of the tester, e.g., test head 112. One of a plurality of screws and screw holes for screwing the frame onto the PCB is shown as 317. In one embodiment, the load board is approximately 13.5 inches by 15.15 inches. The PCB is about 5 mm thick.

A metal docking plate 307 is mounted on the PCB 301 around and over the socket 303 using a set of screws. The docking plate 307 has two pairs of male tapered docking pins 309 and 310. The handler locks into position onto the docking plate guided by the pairs of docking pins 309 and 310. The docket plate has a cavity positioned over the socket 303 so that the handler can insert and remove a DUT with the docking plate in place. The socket 303 is located a known distance relative to the docking pins such that the handler can automatically remove a just-tested chip from the socket and insert a new DUT into the socket for testing.

The printed circuit board has a set of matching components (not shown) and traces for RF and microwave signals, DC supplies, current sources, and also test signal paths to sets of test points, as required. The test points can be probed by the tester. One set of test probes points is shown as 323 in FIG. 3.

The load board 300 also includes a set of plug-in RF connectors on the non-DUT side of the frame that plug into the test head of the tester. The locations of such connectors are shown dotted in FIG. 3A. Two such connectors are indicated by reference numerals 321 and 322, respectively.

Figure 3B:
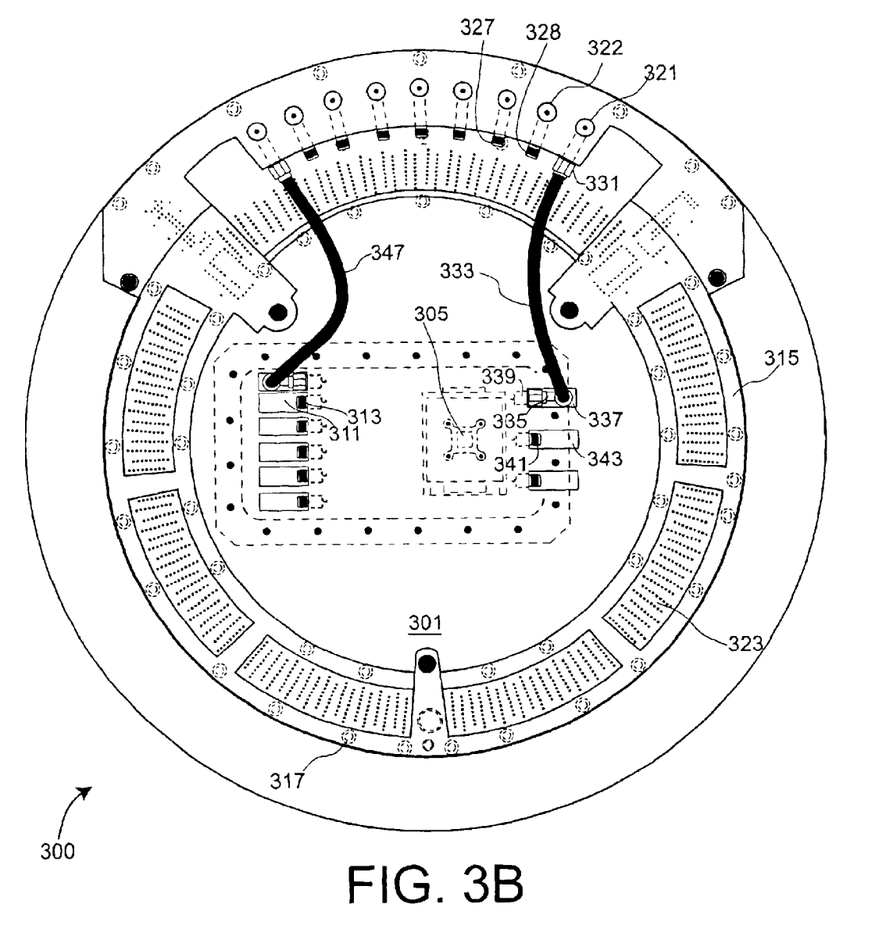
FIG. 3B shows the non-DUT side of the same load board embodiment. A docking plate is included on the DUT side.

FIG. 3B shows the non-DUT side, i.e. the tester side of the load board assembly 300 that includes the PCB 301 connected to the frame 315. The frame 315 includes the set of plug-in RF connectors—e.g., the two connectors 321—that each plugs into the test head so that RF signals can connect the RF signals to and from the test system. Each plug-in connector is coupled to an RF connector; two such RF connectors are indicated by reference numeral 327 and 329, respectively. In one embodiment, the RF connectors are male SMA jacks. Cables, typically flexible or semi rigid coaxial cables are used to connect the RF signals from and to the test system to the DUT in socket 303. One aspect of the invention is guiding the RF signals in such cables from the tester side of the PCB of the load board to the DUT side of the PCB in a manner suitable for the multi-GHz frequencies of interest and in a manner that does not require tuning for different frequencies. An aspect of the invention removes the skill requirement for commissioning the load board, and thereby enables easy technology transfers between test houses. In particular, an aspect of the invention removes discontinuities from the RF path.

In the prior art, a common discontinuity is that caused by the need to have one or more sharp bends in signal paths in order to carry signals from one side of the board into another. A connector soldered into a printed circuit board 301 used for the load board 300 could cause this kind of problem. Prior art load boards typically use right angle connectors and the result is a discontinuity (See FIG. 2). Another problem that occurs when such right angle connectors are used is that there is a chance of inconsistent soldering. Inconsistent, e.g., poor lumpy soldering around a pin of a connector can cause significant performance degradation for the frequencies of interest.

One embodiment of the load board includes a coaxial connection from the non-DUT side to the DUT side of the PCB such that no bends in traces on the PCB are needed. The load board includes an aperture at any location where the RF signal path transfers from one side of the board to the other. The PBC 301 shown in FIGS. 3A and 3B includes nine such apertures. One such aperture is shown in FIGS. 3A and 3B as aperture 311.

Use of Standard Component

One embodiment uses a standard off-the-shelf end launch connectors that is mounted on one edge of each of the apertures. The end launch connectors are electrically coupled to the DUT socket. One such end launch connector is shown as connector 313 in FIGS. 3A and 3B.

Figure 4:
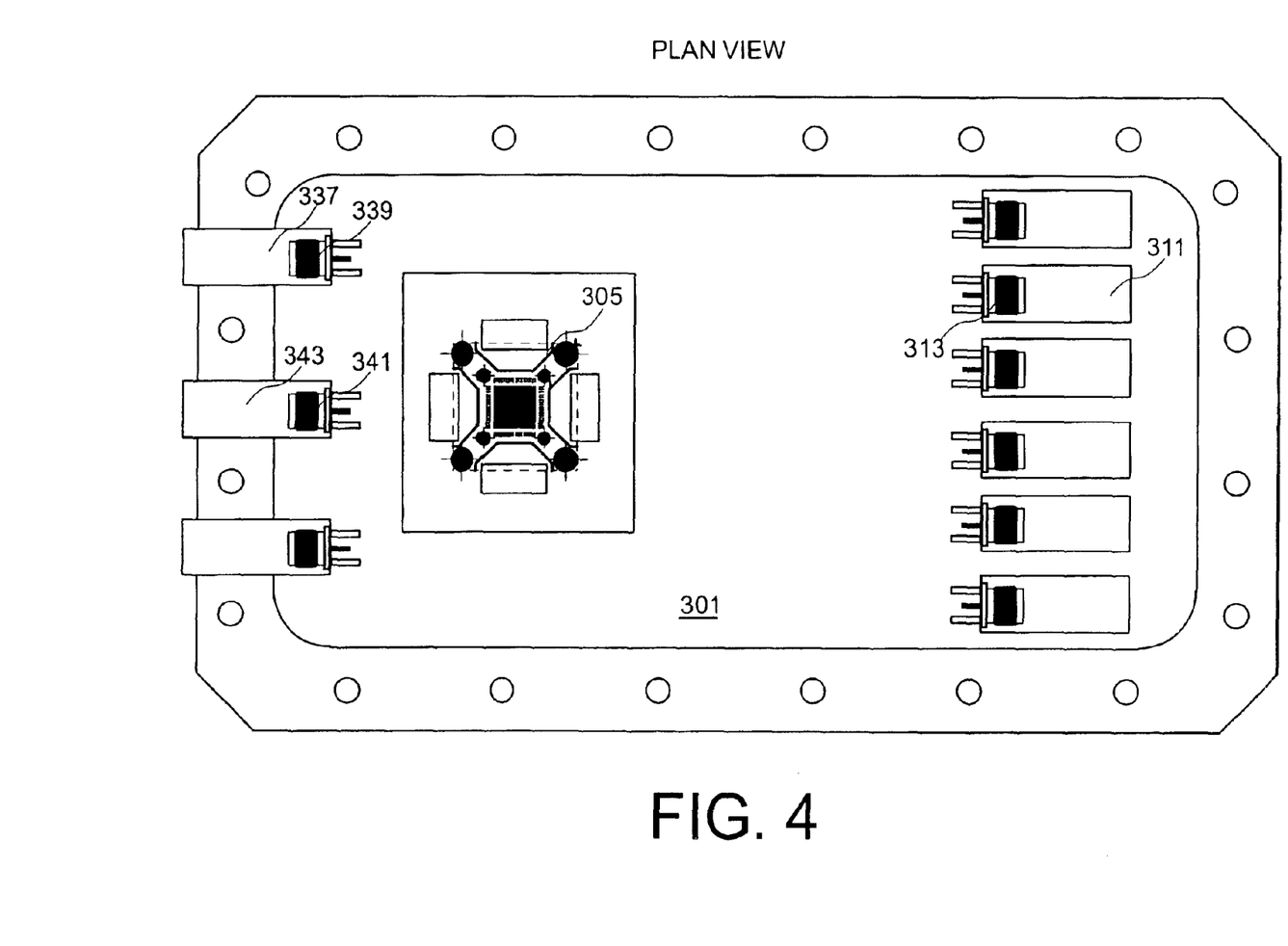
FIG. 4 shows the DUT side of a region around the DUT socket of the load board of FIGS. 3A and 3B in more detail, with no docking plate attached.

FIG. 4 shows in more detail part of the DUT side of the PCB 301 with the metal docking plate 307 unattached. Three of the nine apertures are apertures 311, 337, and 343 with end launch connectors 313, 339, and 341, respectively. While there are nine apertures in this particular load board, other load boards may have more or fewer apertures as required for RF signals to travel from one side of the load board to the other.

Figure 5A:
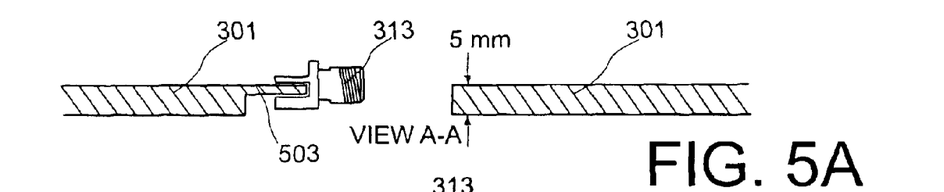
FIGS. 5A and 5B show the details of how an end laugh connector is mounted to the PCB of a load board according to one embodiment of the invention.
Figure 5B:
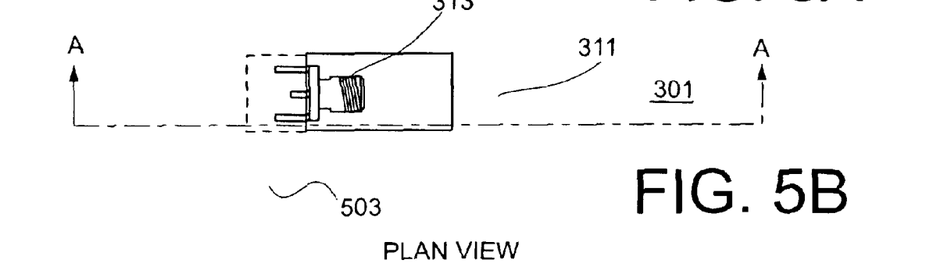

FIGS. 5A–5D show the details of such an embodiment. FIG. 5B shows a plan view of one aperture 311 and FIG. 5A shows the cross-section marked AA in FIG. 5B. An end launch connector 313 is soldered onto the edge of the board 301 at the aperture 311. The end launch connector in this embodiment includes a set of legs and a center conductor that are soldered onto pads on the DUT side of the PCB 301. To compensate for the transition from coaxial to microstrip traces on the PCB, the trace widths that the center and the legs of the end launch conductor 313 are designed to provide a low VSWR over a wide bandwidth.

In one embodiment, each of the end launch connectors is an SMA 50 Ohm connector made by Johnson Components, Waseca, MN. Each is a jack receptacle, i.e., a "male" receptacle. See the Johnson Components catalog titled "SMA—50 Ohm Connectors" for a description of the connectors. The catalog provides tabulated dimensions for the traces on the board determined experimentally to achieve relatively low VSRW, typically less than 1.5 up to 18 GHz. Such selection of trace widths is part of "matching" for a frequency range. In the case of the particular SMA connectors used, no additional matching is required for the end launch connectors and connection to the connectors.

The Johnson Components catalog titled "SMA—50 Ohm Connectors" is incorporated herein by reference.

The PCB includes circuit components for matching in the electric coupling to the DUT socket. Other embodiments may require using matching components for the SMA connectors as well. Such matching does not change from test to test and from signal to signal.

Off the shelf SMA connectors are made for PCBs about 1.57 mm, 1.07 mm, and 1.19 mm thick. The load board 301 is about 5 mm thick. In one embodiment, a region 503 of the PCB adjacent and including the edge of the PCB where the end launch connector is mounted is first thinned out to accommodate an off the shelf end launch connection. The board is a multilayer board, and the thinning out is achieved by having fewer layers in the thinned out region, i.e., some of the outermost layers on the non-DUT side of the PCB have apertures that are larger in one dimension.

In one embodiment, the region is thinned out to 1.19 mm, and the end launch connector is Johnson Components model 142-0711-881.

To connect between the end launch connector and the connector on the non-DUT side of the load board 301, one embodiment uses a flexible or semi rigid coaxial cable that is attached to a matching plug ("female") 50 Ohm SMA connector. Unlike the prior art, e.g., FIG. 2A, no bends are involved.

Figure 5C:
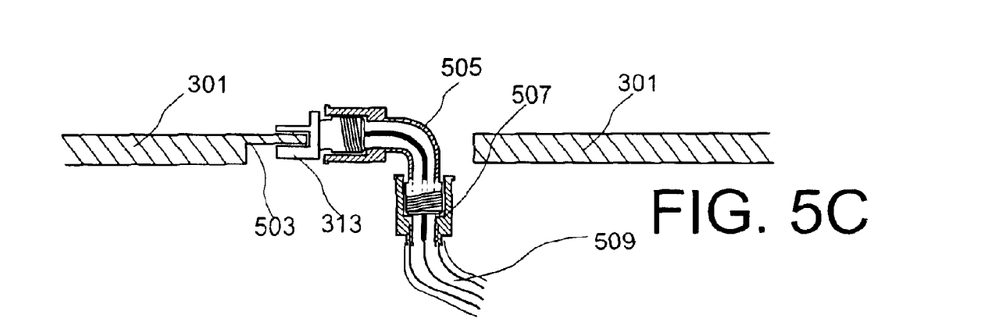
FIG. 5C uses a 90-degree adapter, and FIG. 5D includes a cable directly connected to the end launch connector.

The embodiment shown in FIG. 5C and FIG. 3B also uses a 90 degree SMA adapter 505 that includes a female receptacle at one end to screw into the end launch connector 313, and a male SMA jack at the other end. A cable 509 with a matching female SMA receptacle 507 attached is screwed onto each adapter 505. Note that the 90-degree adapter shown in FIG. 5C has a tight but smooth bend. Other shaped adapters also may be used as the 90-degree adapter.

Referring back to FIG. 3B showing the non-DUT side of the load board, end launch connectors 339 is shown connected to a 90 degree SMA adapter 335 onto which a cable 333 is attached. The cable 333 has two female SMA sockets. One such socket 331 is shown connected to the mail jack coupled to the RF plug-in connector 321. A second cable 347 also is shown connecting the RF plug-in connector on the non-DUT side to the end-launch connector on the DUT side of the load board.

Figure 5D:
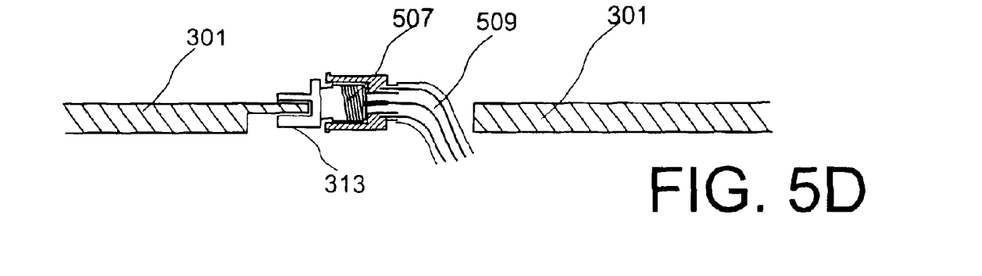

Another embodiment is shown in FIG. 5D according to which a cable 509 with a female SMA receptacle 507 attached is screwed onto the end launch connector 313. The cable is either flexible or semi rigid, and directly connects from the top (DUT) side of the load board to the opposite side for inputting or outputting RF signals. No 90-degree SMA adapter is used.

Use of Special Component

Figure 6A:
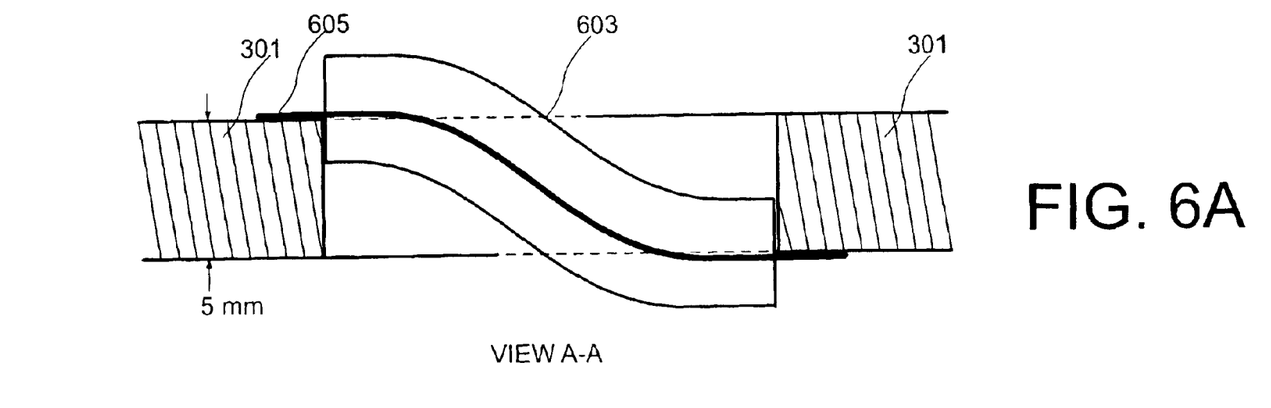
FIG. 6 shows one embodiment of using a smoothly bent semi rigid cable to provide a coaxial connection from the DUT side of the load board to the non-DUT side of the load board.
Figure 6B:
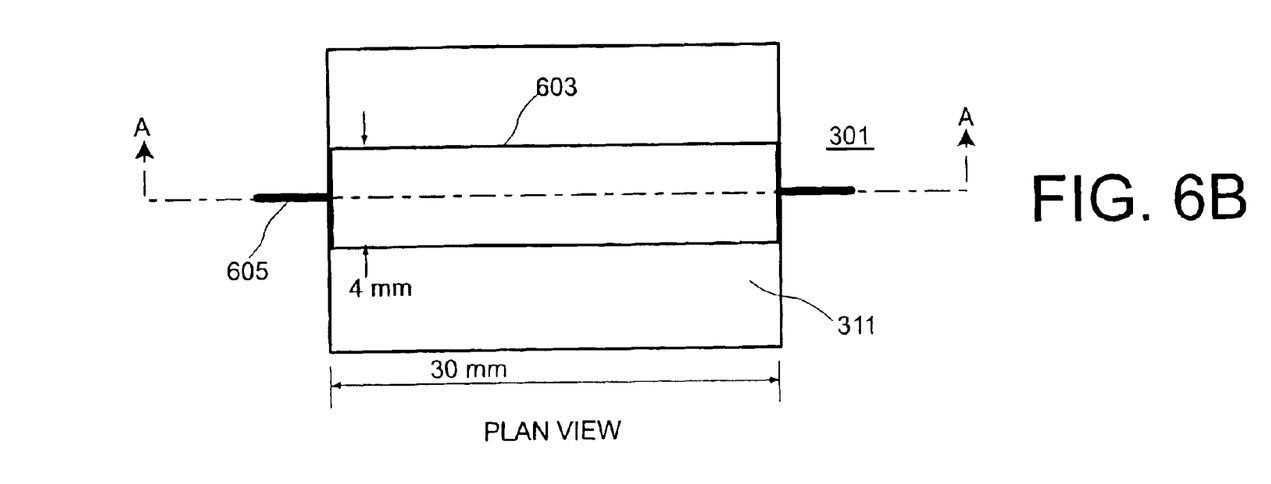

FIGS. 6A and 6B illustrate an alternate embodiment that does not use standard components, but on the other hand does not require the thinning out to accommodate off the shelf end launch connectors, and is potentially less expensive.

FIG. 6B is a plan view and FIG. 6A is the cross section AA of a region of the load board 301 around one of the apertures 311. A semi rigid coaxial RF cable is bent in a smooth manner to avoid RF mismatch—to an approximate S-shape in one embodiment—and placed in the aperture to carry an RF signal to or from one plane—the DUT side—from or to the opposite side of the load board.

In one embodiment, the semi-rigid cable is soldered onto traces on the DUT side of the board and attached to a connector on the other. In another embodiment, the semi-rigid cable is soldered onto traces on each side of the board, and matched. In both semi-rigid cable embodiments, the traces on the DUT side of the board are electrically coupled to the DUT terminal via a matching network. The matching is carried out once only. In one embodiment, a surface mount SMA connector is soldered onto the traces. Matching is needed only for the surface mount SMA connector and the smooth-bend semi-rigid cable. A cable is used to connect the surface mount SMA connector on the non-DUT side to the RF plug-in connector.

The matching in one embodiment is up to the approximately 5 GHz frequency range, in particular including the frequencies of the IEEE 802.11a standard that are slightly higher than 5 GHz, hence use of the phrase "approximately 5 GHz." In another embodiment, the matching is for a frequency range up to approximately 5.8 GHz. In yet another embodiment, the matching is for a frequency range up to approximately 15 GHz. The SMA connectors used are good up to 18 GHz, so in another embodiment, the matching is for a frequency range up to approximately 18 GHz.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

It should further be appreciated that some embodiments have been described using "end launch" connectors. The phrase "end launch connector at the edge of the aperture" in the description and claims means an off-the-shelf connector mountable and mounted on or near the edge of the aperture and suitable for the frequencies of interest such that once mounted and matched, no further matching or matching components are required.

It should further be appreciated that some embodiments have been described using "end launch" connectors. The claims state matching for a range of frequencies. In the embodiments described above, the only matching needed for the end launch connectors was using the trace widths specified by the manufacturer. Other end launch connectors may require further matching that should not vary from test to test and DUT to DUT once the board is manufactured.

It should further be appreciated that some embodiments have been described using SMA connectors, other connectors also may be used. Furthermore, although the invention has been described in the context of testing chips used for local area wireless networks, the invention is not limited to such contexts and may be utilized in various other RF applications and systems.

In one embodiment shown in FIG. 1, the test head is horizontal. The test head may be at other angles depending on the DUT and on the automatic loader being used.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. A load board for connecting to a tester for testing an RF integrated circuit device ("DUT"), the load board comprising:
   a printed circuit board ("PCB") having a DUT side and a non-DUT side, the DUT side including a socket into which a DUT is insertable, the non-DUT side accessible to one or more RF connectors to which an RF cable is connectable, each RF connector providing an RF connection to a tester such that RF signals can be input to or output from the tester from or to the DUT inserted in the socket, the PCB further including at least one aperture for making a coaxial connection therethrough to a cable connected to one of the RF connectors, each coaxial connection through each aperture electrically coupled to the socket on the DUT side of the PCB and matched for a range of frequencies up to at least approximately 5 GHz, including the frequencies used in the IEEE 802.11a standard.

2. A load board as recited in claim 1, wherein the range of frequencies is up to at least approximately 5.8 GHz.

3. A load board as recited in claim 2, further comprising:
   a frame onto which the PCB is attached, the frame including the RF connectors on the non-DUT side.

4. A load board as recited in claim 2, wherein the PCB includes an end launch connector on one edge of the aperture through which there is a coaxial connection, the end launch connector electrically connected to the socket and matched for the range of frequencies up to at least 5.8 GHz, such that the coaxial connection through the aperture is via the end launch connector at the edge of the aperture.

5. A load board as recited in claim 4, wherein the end launch connector is an SMA connector.

6. A load board as recited in claim 4, wherein the end launch connector is an off-the-shelf end launch connector, and wherein region around the edge of the aperture where the end launch connector is mounted is thinned out to accommodate the off-the-shelf end-launch connector.

7. A load board as recited in claim 6, wherein the PCB is a multilayer PCB and wherein the thinned out region has fewer layers than the non-thinned out areas of the PCB.

8. A load board as recited in claim 4, further including a 90 degree adapter attached to the end launch connector, such that the 90 degree adapter provides for a cable to be attached between the 90 degree adapter and one of the RF connectors on the non-DUT side.

9. A load board as recited in claim 4, wherein a cable is attached between the end launch connector and a particular one of the RF connectors on the non-DUT side through the aperture of the end launch connector.

10. A load board as recited in claim 2, wherein the coaxial connection through each aperture uses a semi rigid coaxial RF cable bent in a smooth manner to avoid RF mismatch, the cable soldered onto traces on the DUT side of the PCB, and placed through the aperture to carry an RF signal to or from the DUT side from or to the non-DUT side of the PCB.

11. A load board for connecting to a tester for testing an RF integrated circuit device ("DUT"), the load board comprising:
   a printed circuit board ("PCB") having a DUT side and a non-DUT side, the DUT side including a socket into which a DUT is insertable, the non-DUT side accessible to one or more RF connectors to which an RF cable is connectable, each RF connector providing an RF connection to a tester such that RF signals can be input to or output from the tester from or to a DUT inserted in the socket, the PCB further including at least one aperture having an end launch connector on one edge on the DUT side, the aperture for making a coaxial connection from the end launch connector on the DUT side through the aperture to one of the RF connectors on the non-DUT side, the end launch connector electrically coupled to the socket and matched for a range of frequencies up to at least approximately 5 GHz, including the frequencies used in the IEEE 802.11a standard.

12. A load board as recited in claim 11, wherein the range of frequencies is up to at least approximately 5.8 GHz.

13. A load board as recited in claim 12, wherein the end launch connector is an SMA connector, and the range of frequencies is up to at least 15 GHz.

14. A load board as recited in claim 13, wherein the range of frequencies is up to at least approximately 18 GHz.

15. A load board as recited in claim 11, further comprising:
   a frame onto which the PCB is attached, the frame including the RF connectors on the non-DUT side.

16. A load board as recited in claim 11, wherein the end launch connector is an off-the-shelf end launch connector, and wherein region around the edge of the aperture where the end launch connector is mounted is thinned out to accommodate the off-the-shelf end-launch connector.

17. A load board as recited in claim 16, wherein the PCB is a multilayer PCB and wherein the thinned out region has fewer layers than the non-thinned out areas of the PCB.

18. A load board as recited in claim 11, further including a 90 degree adapter attached to the end launch connector, such that the 90 degree adapter provides for a cable to be attached between the 90 degree adapter and one of the RF connectors on the non-DUT side.

19. A load board as recited in claim 11, wherein a cable is attached between the end launch connector and one of the RF connectors on the non-DUT side through the aperture of the end launch connector.

20. A board for connecting to a means for testing an RF integrated circuit device ("DUT"), the board comprising:

a DUT side and a non-DUT side, the DUT side including a socket means into which a DUT is insertable, the non-DUT side accessible to a first means for connecting onto which a first end of an RF cable is connectable, the RF cable having a second end, the first means for connecting providing an RF connection to a means for testing the DUT;

an aperture having an edge; and a second means for connecting onto which the second end of the RF cable is connectable, the second means for connecting located at the edge of the aperture and electrically coupled to the socket means on the DUT side of the board, the socket means and the second means for connecting coupled hereto matched for a range of frequencies up to at least approximately 5 GHz, including the frequencies used in the IEEE 802.11a standard, such that a cable connected at its second end to the second means for connecting, passing through the aperture, and connected to the first means for connecting provides an RF connection between the DUT in the socket means and the means for testing.

21. A method for connecting radio frequency signals from a first side ("DUT side") of a load board to the second side ("non-DUT side") of the load board, the load board for connecting to a tester for testing an RF integrated circuit device ("DUT"), the load board including a socket on the DUT side into which the DUT is insertable, the method comprising:

providing at least one aperture on the load board;

making a coaxial connection from the DUT side of the load board to the non-DUT side of the load board through the aperture, such that the coaxial connection has a DUT end and a non-DUT end;

electrically coupling the DUT end of the coaxial connection with the socket; and matching the coaxial connection for a range of frequencies up to at least approximately 5 GHz, including the frequencies of the IEEE 802.11a standard, the non-DUT end of the coaxial connection being accessible to one of a set of one or more RF connectors onto which an RF cable is connectable, each RF connector providing an RF connection to the tester, the coaxial connection through the aperture provided by a cable connected to one of the RF connectors, such that the method provides RF signals in the range of frequencies to be input to or output from the tester from or to the DUT inserted in the socket.

22. A method as recited in claim 21, further comprising:

mounting an end launch connector on an edge of the aperture through which there is the coaxial connection, the end launch connector electrically coupled to the socket and matched for the range of frequencies up to at least 5.8 GHz, such that the electrical coupling on the DUT side of the coaxial connection with the socket is via the end launch connector at the edge of the aperture.

* * * * *